United States Patent
Shin

(10) Patent No.: US 7,512,200 B2
(45) Date of Patent: *Mar. 31, 2009

(54) CIRCUIT TO DETECT CLOCK DELAY AND METHOD THEREOF

(75) Inventor: Young-min Shin, Seoul (KR)

(73) Assignee: Samsung Electronics Co, Ltd., Suwon, Kyungki-Do (KR)

( * ) Notice: Subject to any disclaimer, the term of this patent is extended or adjusted under 35 U.S.C. 154(b) by 593 days.

This patent is subject to a terminal disclaimer.

(21) Appl. No.: 10/675,706

(22) Filed: Jan. 9, 2004

(65) Prior Publication Data

US 2004/0109517 A1 Jun. 10, 2004

(30) Foreign Application Priority Data

Oct. 28, 2002 (KR) ...................... 10-2002-0065940

(51) Int. Cl.
*H04L 7/00* (2006.01)

(52) U.S. Cl. .................... 375/354; 375/371; 455/502; 455/516; 327/141

(58) Field of Classification Search ................ 375/354, 375/356, 357, 359, 373; 370/517; 327/141, 327/142, 144, 161
See application file for complete search history.

(56) References Cited

U.S. PATENT DOCUMENTS

| 4,012,598 | A | * | 3/1977 | Wiley | 375/371 |
| 4,525,849 | A | * | 6/1985 | Wolf | 375/372 |
| 4,979,190 | A | * | 12/1990 | Sager et al. | 375/354 |
| 5,918,040 | A | * | 6/1999 | Jarvis | 713/375 |
| 6,084,934 | A | * | 7/2000 | Garcia et al. | 375/370 |
| 6,647,506 | B1 | * | 11/2003 | Yang et al. | 713/503 |
| 7,072,080 | B1 | * | 7/2006 | Yamamoto | 358/442 |

FOREIGN PATENT DOCUMENTS

| JP | 1161472 | | 6/1989 |
| JP | 2001051944 A | * | 2/2001 |
| KR | 97-007564 | | 2/1997 |
| KR | 2001-17953 | | 3/2001 |
| KR | 2001-0017953 | | 5/2001 |

* cited by examiner

*Primary Examiner*—David C Payne
*Assistant Examiner*—Leon Flores
(74) *Attorney, Agent, or Firm*—F. Chau & Associates, LLC

(57) ABSTRACT

Provided are a circuit and a method of detecting clock delay where the circuit to detect clock delay includes a delay detection circuit and a clock forwarding circuit, the delay detection circuit detects a delay between a predetermined output clock signal and an input clock signal, if the detected delays are identical to one another, the circuit generates an initial parameter corresponding to the delay and if the detected delays are not identical to one another, continuously detects the delay until the detected delays are identical to one another, and generates a reset control signal in response to a system reset signal or a predetermined internal reset signal; the clock forwarding circuit loads and unloads the input data in response to the initial parameter, the circuit to detect clock delay can automatically detect the clock delay necessary for setting the initial parameter of the clock forwarding circuit and reset a master circuit and an external circuit that interfaces with the master circuit, thus performing data transmission without any errors.

18 Claims, 8 Drawing Sheets

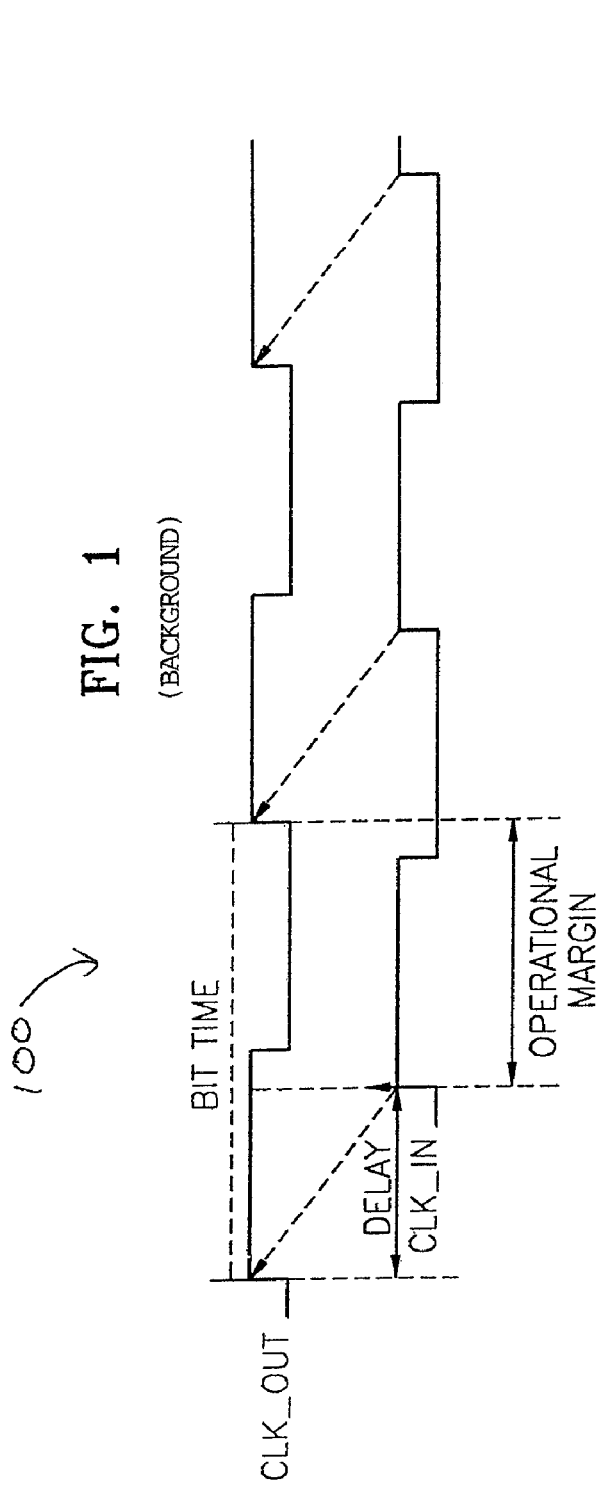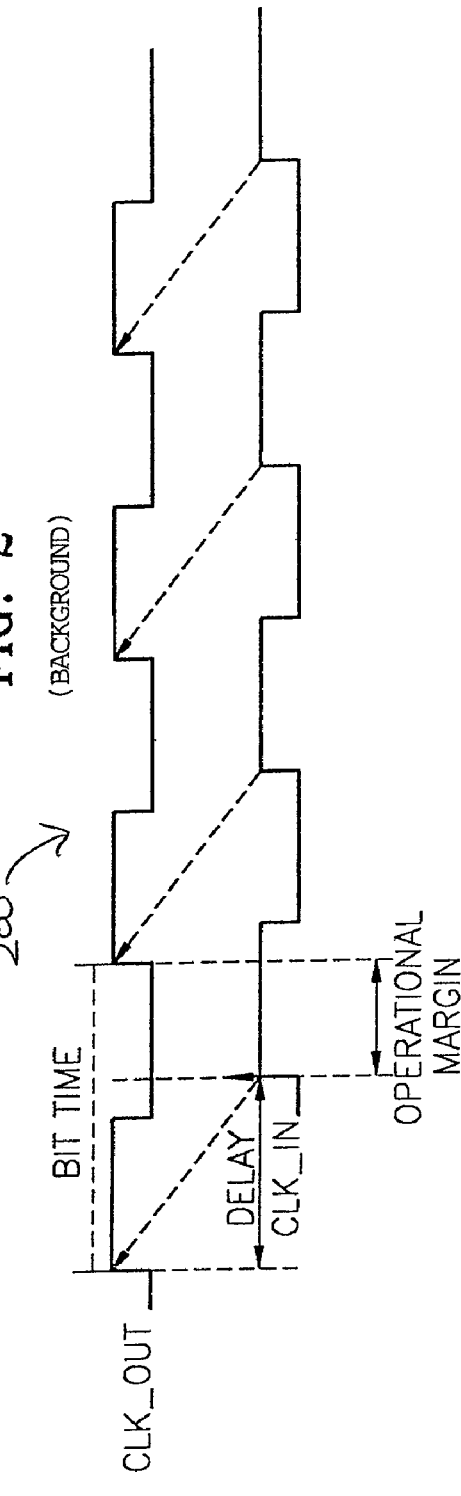

(BACKGROUND)

(BACKGROUND)

| MAXIMUM DELAY | INIT_UNLD<1:0> |
|---|---|
| MD<1BIT TIME | 01 |
| 1<MD≦2BIT TIME | 11 |
| 2<MD≦3BIT TIME | 10 |
| 3<MD≦4BIT TIME | 00 |

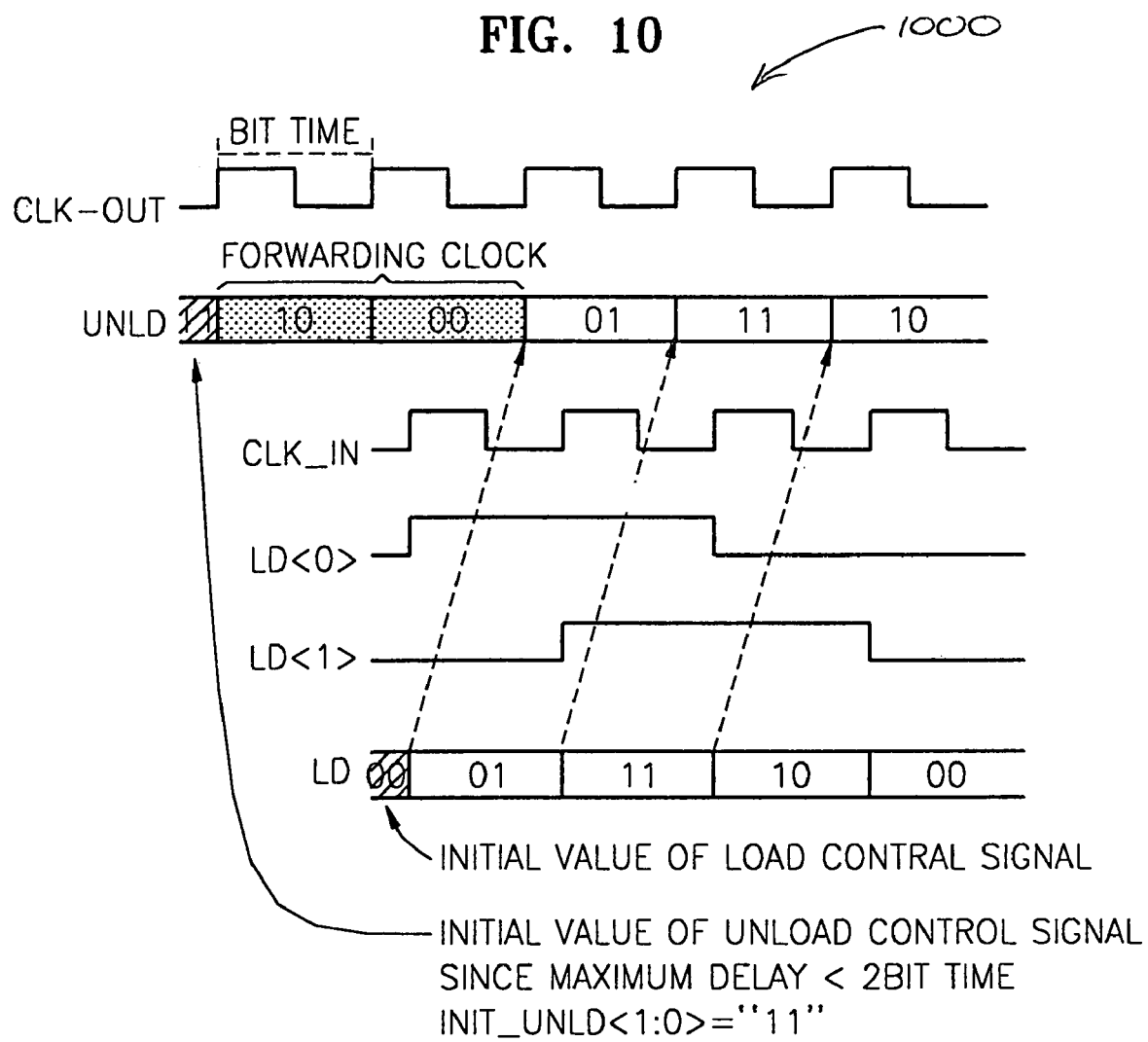

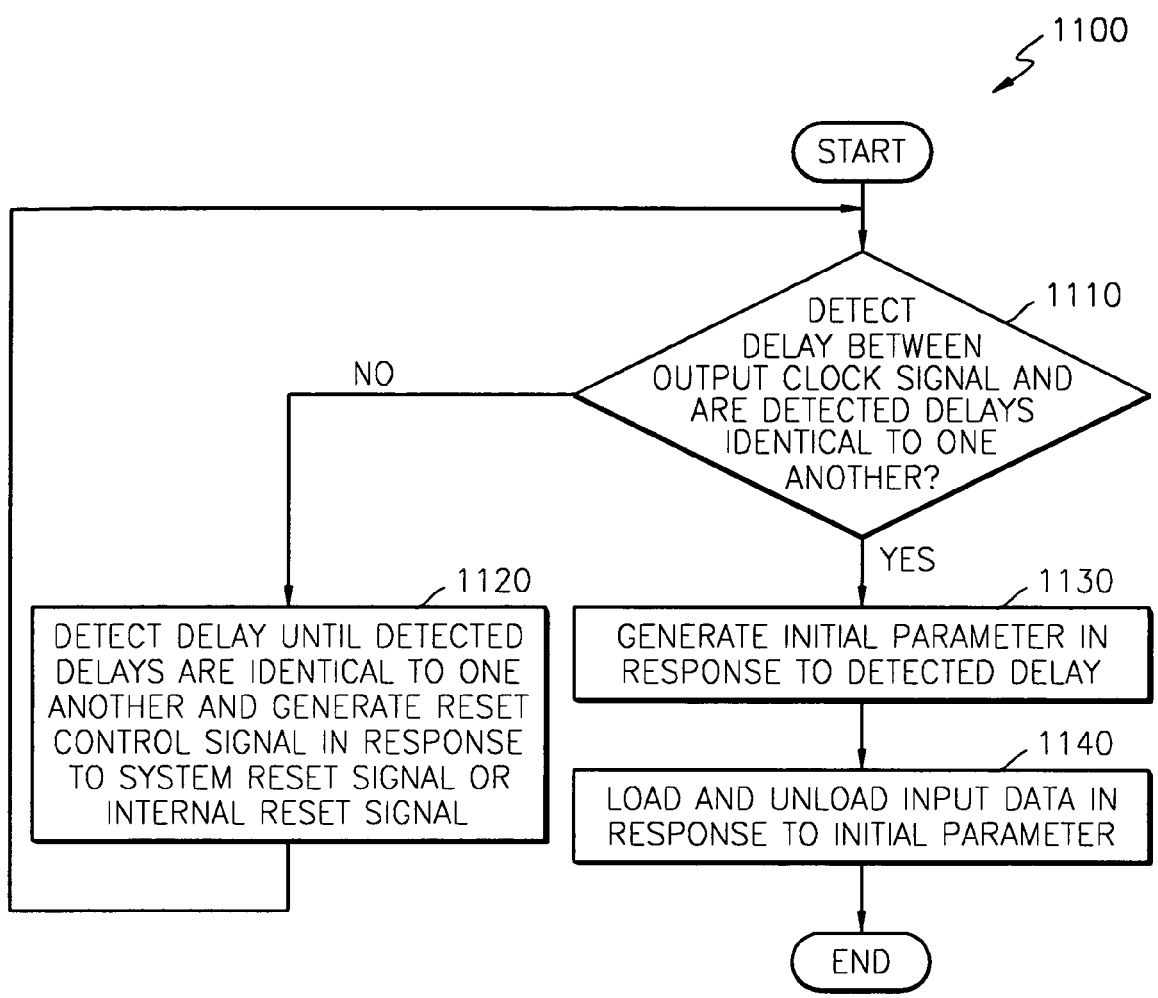

CIRCUIT TO DETECT CLOCK DELAY AND METHOD THEREOF

CROSS-REFERENCE TO RELATED APPLICATION

This application claims foreign priority under 35 U.S.C. § 119 to Korean Patent Application No. 2002-65940, filed on 28 Oct. 2002, in the Korean Intellectual Property Office.

BACKGROUND OF THE INVENTION

1. Field of the Invention

The present invention relates to a semiconductor circuit, and more particularly, to a circuit to detect clock delay.

2. Description of the Related Art

As speed increases in a master circuit, such as a central processing unit ("CPU"), the operational speed of memory or a system bus that interfaces with the master circuit also increases. However, the operational margin of data clocking decreases due to clock delay caused by the circuit structure of a motherboard.

In order to solve such a problem, a clock forwarding method is used wherein the clock signal of a master circuit is transmitted to a slave circuit when data is transmitted from the master circuit to the slave circuit. This allows the slave circuit to fetch data, wherein the clock delay between the master circuit and the slave circuit is analyzed and compensated.

FIG. 1 is a timing diagram for explaining the relationship between a clock signal outputted from a master circuit and a clock signal inputted to the master circuit.

An output clock signal CLK_OUT is outputted from the master circuit (not shown) and sent to the slave circuit (not shown). An input clock signal CLK_IN is outputted from the slave circuit and sent to the master circuit.

The master circuit uses the input clock signal CLK_IN to load data that is sent from the slave circuit and uses the output clock signal CLK_OUT to internally process the loaded data.

Referring to FIG. 1, a timing diagram of CLK_OUT and CLK_IN versus time is indicated generally by the reference numeral 100. A clock delay occurs between the output clock signal CLK_OUT and the input clock signal CLK_IN. The clock delay occurs due to the circuit configuration of a motherboard, which includes the master circuit and the slave circuit. The clock delay is not an important factor when the input clock signal CLK_IN and the output clock signal CLK_OUT are slow. When the input clock signal CLK_IN and the output clock signal CLK_OUT are slow, the operational margin obtained is enough to load or unload data by the master circuit.

FIG. 2 shows a timing diagram indicated generally by the reference numeral 200, describing the output clock signal CLK_OUT and input clock signal CLK_IN at increased speed compared to the timing diagram 100 of FIG. 1.

As the speed of the master circuit and the slave circuit are increased, the operational margin necessary for loading and unloading data by the master circuit is reduced. As a result, errors may occur in data transmission from the slave circuit to the master circuit.

FIG. 3 shows a timing diagram indicated generally by the reference numeral 300, for explaining the case where the operational margin is eliminated due to an increase in speed of the output clock signal CLK_OUT and the input clock signal CLK_IN.

If the speed of the clock signals is increased so that the operational margin is eliminated, it is very difficult to safely transmit data from the slave circuit to the master circuit. In FIG. 3, the output clock signal CLK_OUT precedes the input clock signal CLK_IN, and the operational margin is eliminated. Here, data is processed before data is loaded in the master circuit, indicating an abnormal operation.

In a highly efficient computer operating at a high speed, it becomes difficult to prevent such abnormal operation from occurring. In order to solve such problems, a clock forwarding method has been suggested.

FIG. 4 shows a timing diagram indicated generally by the reference numeral 400, for explaining the relationship between the input clock signal CLK_IN and the output clock signal CLK_OUT according to the clock forwarding method.

Several clock periods transpire according to clock delay and prior to transmission of the output clock signal CLK_OUT. Therefore, data processing by the master circuit is performed after the data loading operation, so that data inputted from the slave circuit can be correctly transmitted to the master circuit.

In the clock forwarding method, fixed initial parameters necessary for data loading and unloading must be determined. In general, the fixed initial parameters are manually determined by a designer of the motherboard and permanently stored in external read-only memory (ROM) (not shown). After power is turned on, the fixed initial parameters are loaded to a clock forwarding circuit (not shown) for forwarding clock signals when the master circuit is initialized. Data, which is inputted to the master circuit by the clock forwarding circuit, can be processed without any abnormal operation.

The clock forwarding method is shown in several U.S. patent documents, including U.S. Pat. No. 4, 811, 364, issued to Seger et al. on 7 Mar. 1989, entitled "METHOD AND APPARATUS FOR STABILIZED DATA TRANSMISSION"; U.S. Pat. No. 4, 979, 190, issued to Seger et al. on 18 Dec. 1990, entitled "METHOD AND APPRATUS FOR STABILIZED DATA TRANSMISSION"; and U.S. Pat. No. 4, 525, 849, issued to Wolf on 25 Jun. 1985, entitled "DATA TRANSMISSION FACILITY BETWEEN TWO ASYNCHRONOUSLY CONTROLLED DATA PROCESSING SYSTEMS WITH A BUFFER MEMORY".

However, since the initial parameters used in the clock forwarding method are determined by the designer of the motherboard, production cost increases. In addition, given that the initial parameters are stored in ROM, errors may occur in data transmission of some products.

Further, when the clock forwarding method is used, the clock forwarding circuit and the slave circuit included in the master circuit, e.g., a memory or a chip set, must be reset at the same time, which only occurs through a system reset. Also, due to noise in the slave circuit, errors can occur in data transmission.

SUMMARY OF THE INVENTION

The present invention provides a circuit for automatically detecting clock delay, which is used for determining an initial parameter of a clock forwarding circuit, and directly controlling reset of an external slave circuit. The present invention also provides a method of automatically detecting clock delay, which is used for determining an initial parameter of a clock forwarding circuit, and directly controlling reset of an external slave circuit.

According to an aspect of the present invention, there is provided a digital system comprising a master circuit and a slave circuit. The master circuit, which includes a circuit to detect clock delay, receives a system reset signal, and generates output data, an output clock signal with which the output data is synchronized, and a reset control signal which responds to the system reset signal. The slave circuit is reset in response to a reset control signal, receives the output clock signal and the output data, and sends to the master circuit an input clock signal as a feedback signal of the output clock signal and input data that is synchronized with the input clock signal. The circuit to detect clock delay generates the reset control signal in response to the system reset signal or an internal reset signal, detects a delay between the output clock signal and the input clock signal, and loads and unloads the input data in response to an initial parameter corresponding to the delay. The internal reset signal is a clock signal generated when detected delays are not identical to one another.

According to another aspect of the present invention, there is provided a circuit to detect clock delay including a delay detection circuit and a clock forwarding circuit. The delay detection circuit detects a delay between an output clock signal and an input clock signal, generates an initial parameter corresponding to the delay if detected delays are identical to one another or continuously detects the delays until the detected delays are identical to one another if detected delays are not identical to one another, and generates a reset control signal in response to a system reset signal or an internal reset signal. The clock forwarding circuit loads and unloads input data in response to the initial parameter.

The delay detection circuit further comprises a detection circuit, a comparison circuit, and a control circuit. The detection circuit is used to detect a delay between the output clock signal and the input clock signal. The comparison circuit compares the detected delays and generates the initial parameter when the detected delays are identical to one another. If the detected delays are not identical to one another, the control circuit resets the detection circuit, generates the reset control signal in response to the internal reset signal, and controls the comparison circuit to perform a comparison operation by N-bit free running until all the detected delays are identical to one another.

The detection circuit comprises a counting unit, which includes two D-type flip flops that are synchronized with the output clock signal and are reset by the input clock signal, and a detection unit, which receives output of the counting unit and detects the delay between the output clock signal and the input clock signal in response to the input clock signal.

The comparison circuit further comprises a latch unit, which includes a demultiplexer and N latches, respectively, where the latches most significant bits and least significant bits of the delays are outputted from the detection unit by N-bit free running, and a comparison unit, which compares the most significant bits and least significant bits outputted from the latch unit, outputs one of the most significant bits and one of the least significant bits as the initial parameters, and outputs a first signal at a first level if all most significant bits and least significant bits are respectively identical to one another, or outputs the first signal at a second level if all most significant bits and least significant bits are not respectively identical to one another.

The control circuit comprises an N-bit free running counter/decoder, which controls the demultiplexer to perform N-bit free running in response to the first signal and sends a predetermined clock signal to the latch unit, a system clock control unit, which receives the clock signal in response to the first signal and outputs the clock signal as an internal reset signal, a reset control unit, which receives the system reset signal or the internal reset signal, sends the received system reset signal or internal reset signal to the N-bit free running counter/decoder, resets the detection unit, and outputs the system reset signal or the internal reset signal as the reset control signal.

The clock forwarding circuit comprises a clock generator, which is reset in response to output of the system clock control unit and generates the clock signal, an internal data bus, which is used for data interface with a predetermined master circuit, a data control unit, which is connected to the internal data bus and outputs data to a slave circuit in response to the clock signal, an output clock signal control unit, which outputs the output clock signal to the slave circuit in response to the clock signal, an input clock signal control unit which receives and controls the clock signal and outputs the controlled clock signal, a load/unload clock control unit, which receives the controlled clock signal and generates load control signals and unload control signals in response to the initial parameter, and a load/unload multiplexer, which receives input data inputted from the slave circuit and unloads the input data to the internal data bus, through the data control unit, in response to the load control signals and the unload control signals.

The output clock signal is a signal outputted from a predetermined master circuit, the input clock signal is a signal outputted from a predetermined slave circuit, and the input clock signal is a feedback clock of the output clock signal. The internal reset signal is a clock signal generated when one of the detected delays is not identical to other detected delays. The reset control signal is generated when the system reset signal or the internal reset signal is activated.

According to yet another aspect of the present invention, there is provided a method of detecting clock delay comprising (a) detecting a delay between an output clock signal and an input clock signal and generating an initial parameter corresponding to the delay if the detected delays are identical to one another, (b) continuously detecting the delay until the detected delays are identical to one another and generating a reset control signal in response to the system reset signal or the internal reset signal, if the detected delays are not identical to one another, and (c) loading and unloading input data in response to the initial parameter.

Step (a) further comprises (a1) detecting and outputting a delay between the output clock signal and the input clock signal, (a2) respectively latching most significant bits and least significant bits of the delays outputted in step (a1), and (a3) comparing the most significant bits and the least significant bits outputted in step (a2), outputting one of the most significant bits and one of the least significant bits as the initial parameters, and outputting a first signal at a first level if all most significant bits and least significant bits are respectively identical to one another, or outputting the first signal at a second level if all most significant bits and least significant bits are not respectively identical to one another.

Step (b) is characterized by generating the reset control signal for resuming step (a) in response to the first signal if one of the detected delays is not identical to other detected delays and resuming step (a) by N-bit free running until the detected delays are identical to one another.

Step (b) further comprises (b1) generating an internal reset signal in response to the first signal and a predetermined clock signal, (b2) receiving the system reset signal or the internal reset signal, and generating the reset control signal, and (b3) performing N-bit free running in response to the first signal and generating an N-bit free running signal.

Step (c) further comprises (c1) generating the clock signal, (c2) outputting the output clock signal to a slave circuit in response to the clock signal, (c3) receiving and controlling the clock signal, and outputting the controlled clock signal, (c4) receiving the controlled clock signal, and generating load control signals and unload control signals in response to the initial parameter, and (c5) receiving input data inputted from the slave circuit, and unloading the input data in response to the load control signals and the unload control signals.

The output clock signal is outputted from a predetermined master circuit, the input clock signal is outputted from a predetermined slave circuit, and the input clock signal is a feedback clock of the output clock signal. The internal reset signal is generated when the detected delays are not identical to one another. The reset control signal is generated when the system reset signal or the internal reset signal is activated.

BRIEF DESCRIPTION OF THE DRAWINGS

The above and other features and advantages of the present invention will become more apparent by describing in detail exemplary embodiments thereof with reference to the attached drawings, in which:

FIG. 1 is a timing diagram for explaining the conventional relationship between a clock signal outputted from a master circuit and a clock signal inputted to the master circuit;

FIG. 2 is a timing diagram describing the output clock signal and the input clock signal of FIG. 1 at increased speed;

FIG. 10 is a timing diagram for explaining the operation of the circuit of FIG. 6; and FIG. 11 is a flowchart for explaining a method of detecting the clock delay.

DETAILED DESCRIPTION OF PREFERRED EMBODIMENTS

The present invention will now be described more fully with reference to the accompanying drawings, in which preferred embodiments of the invention are shown.

Figure 3:
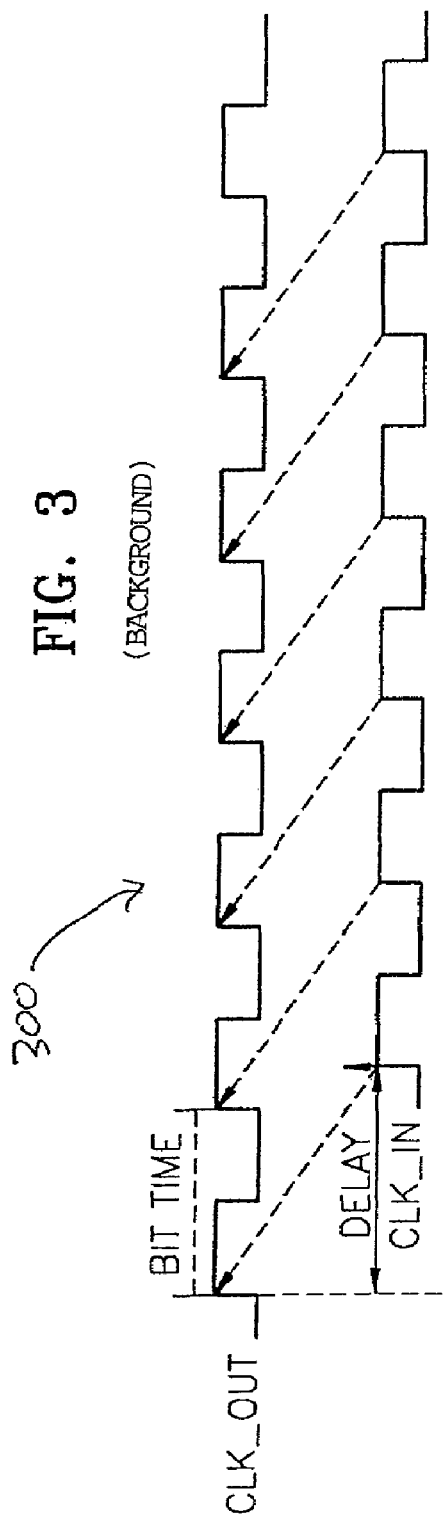
FIG. 3 is a timing diagram for explaining the case where operational margin is eliminated due to increase in speed of the output clock signal and the input clock signal of FIG. 1.
Figure 4:
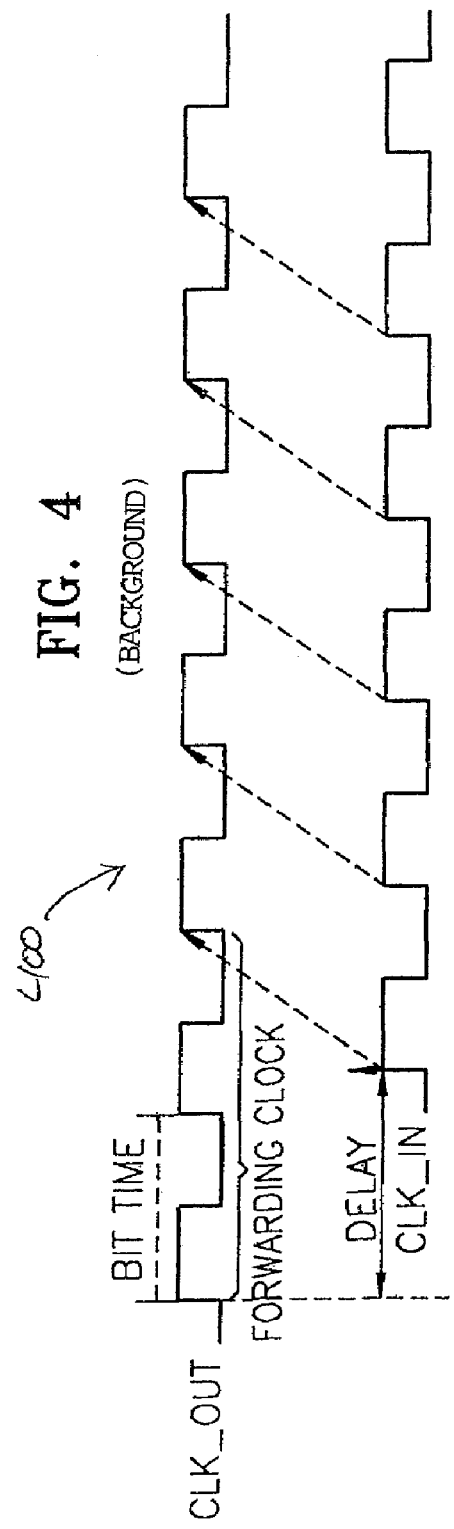
FIG. 4 is a view for explaining the relationship between the input clock signal and the output clock signal according to the clock forwarding method.
Figure 5:
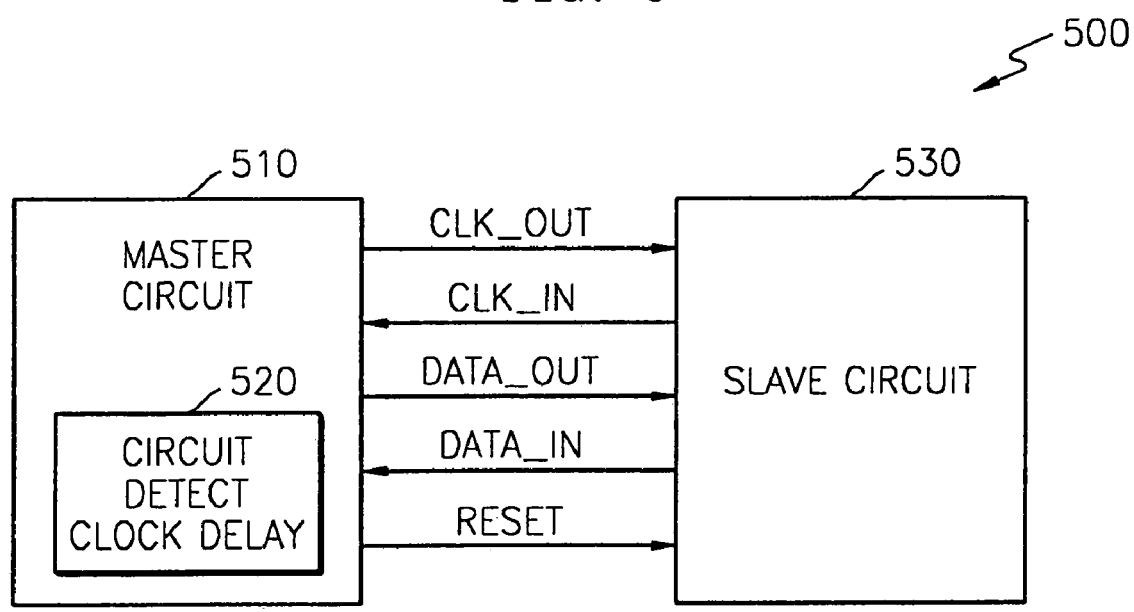
FIG. 5 is a block diagram showing a digital system according to a first embodiment of the present invention.

FIG. 5 is a block diagram showing a digital system according to a first embodiment of the present invention.

Referring to FIG. 5, a digital system 500 according to a first embodiment of the present invention includes a master circuit 510 and a slave circuit 530 in signal communication with the master circuit 510.

The master circuit 510 includes a circuit to detect clock delay 520, and receives a system reset signal (not shown) and generates output data DATA_OUT, an output clock signal CLK_OUT synchronized with the output data DATA_OUT, and a reset control signal RESET that responds to the system reset signal (not shown).

The slave circuit 530 resets itself in response to the reset control signal RESET, receives the output clock signal CLK_OUT and the output data DATA_OUT, and sends the input clock signal CLK_IN and input data DATA_IN to the master circuit 510. The input data DATA_IN is synchronized with the input clock signal CLK_IN, which serves as a feedback clock signal of the output clock signal CLK_OUT.

The master circuit 510 sends the output clock signal CLK_OUT and the output data DATA_OUT to the slave circuit 530. The slave circuit 530 receives the output data DATA_OUT and sends the input data DATA_IN to the master circuit 510. The input data DATA_IN is synchronized with the input clock signal CLK_IN.

Clock delay occurs between the input clock signal CLK_IN and the output clock signal CLK_OUT. The master circuit 510 loads the input data DATA_IN by using the input clock signal CLK_IN, and processes the input data DATA_IN by using the output clock signal CLK_OUT, wherein the clock delay between the input clock signal CLK_IN and the output clock signal CLK_OUT causes an abnormal operation. Thus, the master circuit 510 includes a circuit to detect clock delay 520 between the input clock signal CLK_IN and the output clock signal CLK_OUT and corrects the clock delay.

The circuit to detect clock delay 520 detects clock delay between the output clock signal CLK_OUT and the input clock signal CLK_IN, and loads and unloads the input data DATA_IN in response to an initial parameter corresponding to the clock delay.

The circuit to detect clock delay 520 continuously detects the clock delay between the output clock signal CLK_OUT and the input clock signal CLK_IN. If the detected clock delays are not identical to one another, the circuit 520 continues to detect the clock delays until they are identical to one another. If the detected clock delays are identical to one another, the circuit 520 generates an initial parameter corresponding to the detected clock delay, and, by using the initial parameter, loads or unloads the input data DATA_IN.

The circuit to detect clock delay 520 generates the reset control signal RESET in response to the system reset signal (not shown) or an internal reset signal (not shown). The internal reset signal (not shown) is generated when one or more of the detected clock delays are not identical to one another.

That is, if the detected clock delays are not identical to one another, the circuit to detect clock delay 520 detects the clock delay between the input clock signal CLK_IN and the output clock signal CLK_OUT at several times and generates the internal reset signal. The reset control signal RESET is generated in response to the generated internal reset signal, and if so, the slave circuit 530 is reset. If the internal reset signal is generated, the circuit to detect clock delay 520 is also reset.

After resetting, the clock delay between the input clock signal CLK_IN and the output clock signal CLK_OUT is detected until the detected clock delays are identical to one another of the detected delays are not identical to one another. Detailed operations of the circuit for detecting clock delay will be described later.

Figure 6:
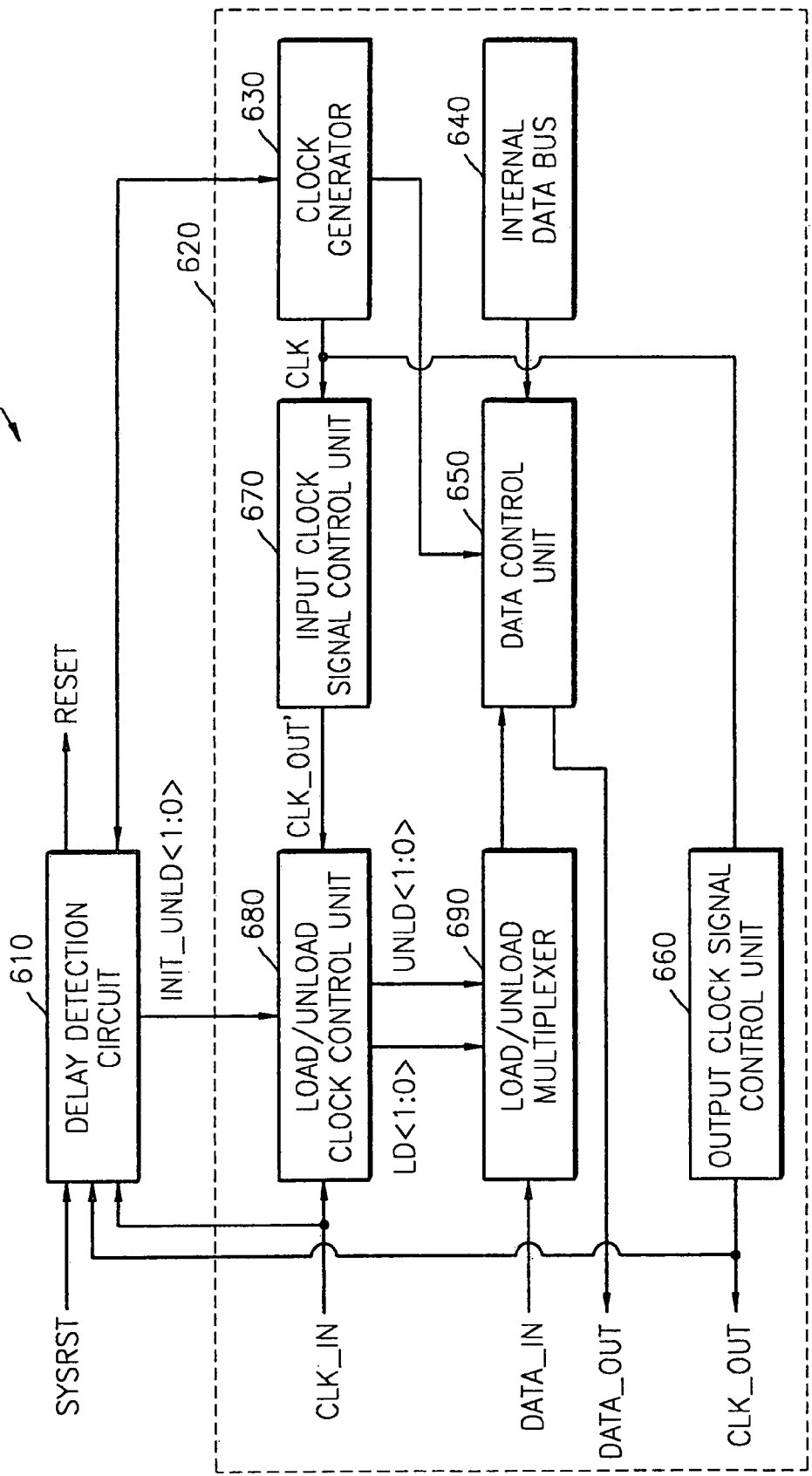
FIG. 6 is a block diagram showing a circuit to detect clock delay according to a second embodiment of the present invention.

FIG. 6 is a block diagram showing a circuit to detect clock delay according to a second embodiment of the present invention.

Referring to FIG. 6, the circuit to detect clock delay 520 is shown according to a second embodiment of the present invention, and includes a delay detection circuit 610 and a clock forwarding circuit 620 in signal communication with the circuit 610.

The delay detection circuit 610 detects the delay between the output clock signal CLK_OUT and the input clock signal CLK_IN, and generates an initial parameter INIT_UNLD<1: 0> corresponding to the delay if the detected delays are identical to one another. The delays are detected until the detected delays are identical to one another. In addition, the delay detection circuit 610 generates a reset control signal RESET in response to a system reset signal SYSRST or an internal reset signal (not shown). The clock forwarding circuit 620 loads and unloads the input data DATA_IN in response to the initial parameter INIT_UNLD<1:0>.

Turning out of sequence to FIG. 11, a flowchart for explaining a method of detecting clock delay is indicated generally by the reference numeral 1100. The method of detecting clock delay shown in FIG. 11 explains the operation of the circuit to detect clock delay 520 of FIG. 5. Thus, the method and the operation of the circuit to detect clock delay 520 will be described together.

At first, a delay between an output clock signal and an input clock signal is detected, and it is determined whether or not all detected delays are identical to one another at step 1110.

If one of the detected delays is different from the other delays, the delays are continuously detected until all detected delays are identical to one another, and the reset control signal is generated in response to the system reset signal or the internal reset signal at step 1120.

If all detected delays are identical to one another, an initial parameter corresponding to the delay is generated at step 1130. Then, input data is loaded and unloaded in response to the initial parameter at step 1140.

Referring again to FIG. 6, an operation of the circuit to detect clock delay 520 will be described in more detail.

The clock forwarding circuit 620 includes a clock generator 630, an internal data bus 640, a data control unit 650, an output clock signal control unit 660, an input clock signal control unit 670, a load/unload clock control unit 680 and a load/unload multiplexer 690.

The clock generator 630 is reset in response to the output of a system clock control unit (not shown) in the delay detection circuit 610 and generates a clock signal CLK. The output clock signal control unit 660 outputs the output clock signal CLK_OUT to the slave circuit (not shown) in response to the clock signal CLK outputted from the clock generator 630.

Here, the output data DATA_OUT transmitted from the internal data bus 640, which is the data interface to the master circuit (not shown), is outputted to the slave circuit (not shown) through the data control unit 650.

The slave circuit (not shown) receives the output clock signal CLK_OUT and the output data DATA_OUT outputted from the master circuit (not shown), and sends the input clock signal CLK_IN and the input data DATA_IN to the clock forwarding circuit 620 of the master circuit (not shown). The input clock signal CLK_IN is a feedback clock signal of the output clock signal CLK_OUT. A delay occurs between the input clock signal CLK_IN and the output clock signal CLK_OUT. The delay occurs due to a configuration of the motherboard, which includes the master circuit and the slave circuit.

The delay detection circuit 610 automatically detects the delay between the input clock signal CLK_IN and the output clock signal CLK_OUT, and sends the initial parameter INIT_UNLD<1:0> corresponding to the delay to the load/unload clock control unit 680. The input clock signal control unit 670 receives and controls the clock signal CLK, and outputs the controlled clock signal CLK_OUT.

The load/unload clock control unit 680 receives the controlled clock signal CLK_OUT and the input clock signal CLK_IN, and generates load control signals LD<1:0> and unload control signals UNLD<1:0> in response to the initial parameter INIT_UNLD<1:0>.

The load/unload multiplexer 690 unloads the input data DATA_IN to the internal data bus 640 through the data control unit 650 and in response to the input data DATA_IN, the load control signals LD<1:0>, and the unload control signals UNLD<1:0>.

The load/unload multiplexer 690 generates initial values of the load control signals LD<1:0> and the unload control signals UNLD<1:0>. The initial value of the load control signals LD<1:0> is set as "00", and the initial value of the unload control signals INIT_UNLD<1:0> is set in response to the initial parameter INIT_UNLD<1:0>.

In response to the load control signals LD<1:0> and the unload control signals UNLD<1:0> generated as described above, the load/unload multiplexer 690 loads the input data DATA_IN to and unloads the loaded input data DATA_IN to the master circuit (not shown) through the data control unit 650. Theses operations avoid errors due to effects of the delay.

Figure 7:
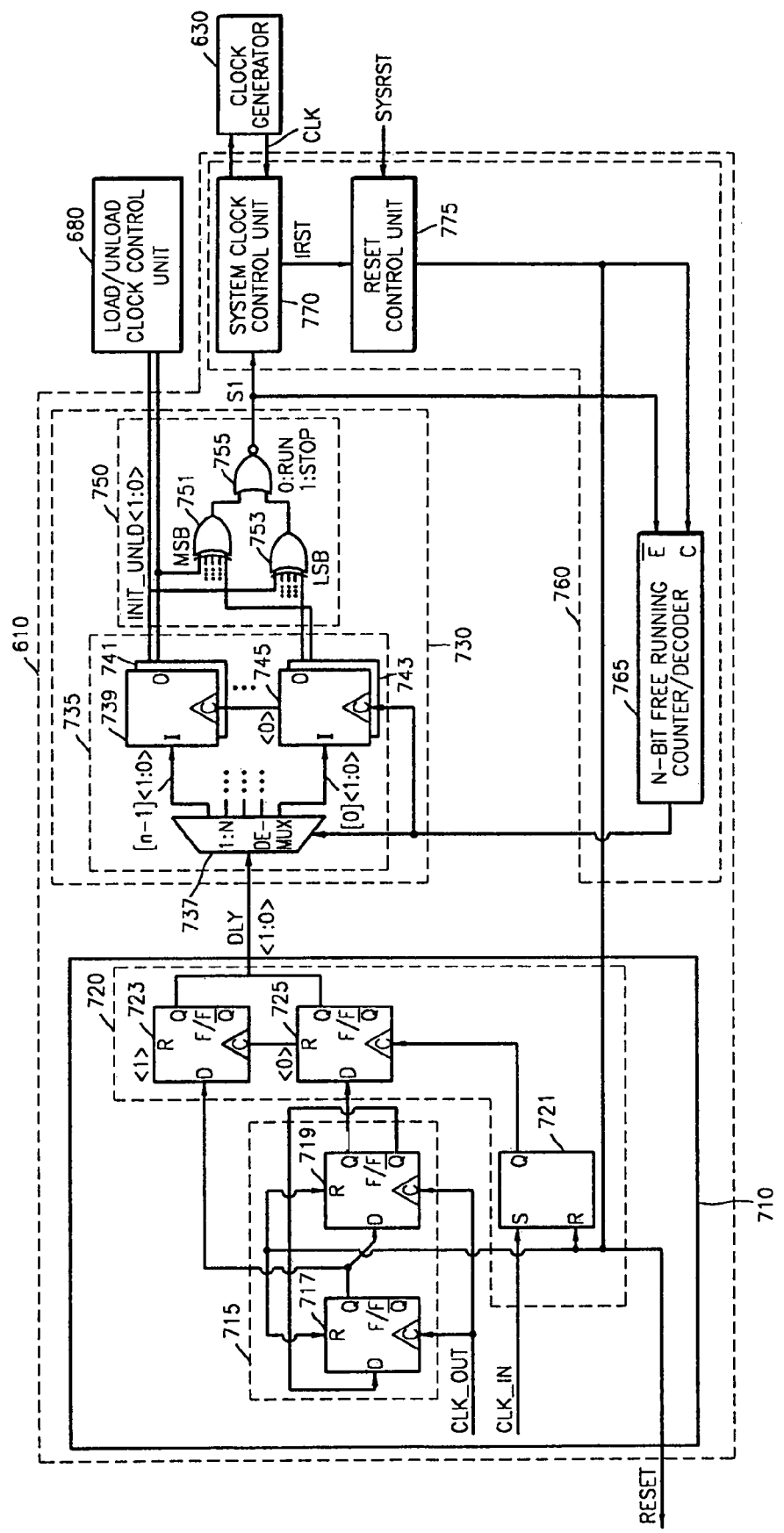
FIG. 7 is a circuit diagram showing the circuit to detect clock delay of FIG. 6.

FIG. 7 is a circuit diagram showing the circuit for detecting clock delay of FIG. 6.

Referring to FIG. 7, the delay detection circuit 610 includes a detection circuit 710, a comparison circuit 730, and a control circuit 760. The detection circuit 710 detects a delay between the output clock signal CLK_OUT and the input clock signal CLK_IN. The comparison circuit 730 compares the detected delays and, if all detected delays are identical to each other, generates the initial parameter INIT_UNLD<1:0>.

If one of the detected delays is not identical to other delays, the control circuit 760 resets the detection circuit 710 and generates the reset control signal RESET in response to an internal reset signal IRST. Here, the clock generator 630 shown in FIG. 6 is also reset. The internal reset signal IRST is a clock signal generated when one of the detected delays is not identical to other delays.

In addition, after the clock generator 630 is released from reset, the control circuit 760 directs the comparison circuit 730 to perform a comparison operation by N-bit free running until all detected delays are identical to each other.

The detection circuit 710 includes a counting unit 715 and a detection unit 720. The counting unit 715 is synchronized with the output clock signal CLK_OUT and includes D-type flip flops 717 and 719 that are reset by the input clock signal CLK_IN. The detection unit 720 receives an output of the counting unit 715, and detects the delay between the output clock signal CLK_OUT and the input clock signal CLK_IN in response to the input clock signal CLK_IN. The detection unit 720 includes D-type flip flops 723 and 725 and an R-S flip flop 721.

The output of the D-type flip flop 717 is sent to the D-type flip flop 723, and the output of the D-type flip flop 719 is sent to the D-type flip flop 725. The input clock signal CLK_IN is sent to the D-type flip flops 723 and 725 through the R-S flip flop 721 as a clock signal.

The D-type flip flops 723 and 725 detect the delay between the output clock signal CLK_OUT and the input clock signal CLK_IN in response to the output of the counting unit 720 and the input clock signal CLK_IN that is inputted from the slave circuit (not shown).

The comparison circuit 730 includes a latch unit 735 and a comparison unit 750. The latch unit 735 includes a demultiplexer 737 and N latches including latches 739, 741, 743, and 745. The latch unit 735 latches most significant bits ("MSBs") and least significant bits ("LSBs") of delays outputted from the detection unit 720 by N-bit free running.

The comparison unit 750 compares the MSBs and the LSBs outputted from the latch unit 735 and, if all MSBs are identical to one another and all LSBs are identical to one another, one of the MSBs and one of the LSBs are outputted as the initial parameters INIT_UNLD<1:0>, and a first signal S1 is outputted at the first level. The comparison unit 750 outputs the first signal S1 at the second level if the MSBs or the LSBs are not respectively identical to one another.

More specifically, the comparison unit 750 includes exclusive OR gates 751 and 753 and includes an inversion OR gate 755. The exclusive OR gates 751 and 753 receive N MSBs and N LSBs of the detected delays through the demultiplexer 737. The exclusive OR gates 751 and 753 compare the MSBs and the LSBs of the detected delays in order to determine whether the outputs of the latch unit 735, i.e., the detected delays, are identical to one another, and outputs comparison results to the inversion OR gate 755.

If the detected delays are identical to one another, the inversion OR gate 755 outputs the first signal S1 at the first level. Then, one of the MSBs of the detected delays and one of the LSBs of the detected delays are outputted to the load/unload clock control unit 680 as the initial parameter INIT_UNLD<1:0>.

However, if the detected delays are not identical to one another, the inversion OR gate 755 outputs the first signal S1 at the second level. Here, the first level is a logic high level, and the second level is a logic low level. Then, the control circuit 760 resets the clock generator 680 and detection circuit 710 in response to the first signal S1 at the second level.

The control circuit 760 includes an N-bit free running counter/decoder 765, a system clock control unit 770 and a reset control unit 775. The N-bit free running counter/decoder 765 is connected between the reset control unit 775 and the latch unit 735. The N-bit free running counter/decoder 765 controls the demultiplexer 737 to perform N-bit free running in response to the first signal S1 and applies a predetermined clock signal to the latch unit 735.

That is, the N-bit free running counter/decoder 765 is activated and performs N-bit free running when the first signal S1 is at the second level, i.e., the logic low level, and directs the demultiplexer 737 to supply the clock signal from the clock generator 630 to the latches of the latch unit 735.

The system clock control unit 770 resets the clock generator 630 in response to the first signal S1 and generates the internal reset signal IRST when the first signal S1 is at the second level, that is, the detected delays are not identical to one another.

The reset control unit 775 receives the system reset signal SYSRST or internal reset signal IRST, sends it to the N-bit free running counter/decoder 765, resets the detection circuit 710 and outputs the system reset signal SYSRST or the internal reset signal IRST as the reset control signal RESET. The system reset signal SYSRST is inputted when the entire system is externally reset. The internal reset signal IRST is generated when the detected delays are not identical to one another.

After reset is released, the detection circuit 710 is converted such that the detection circuit 710 receives the next input, and the demultiplexer 737 receives the output of the detection unit 720 and detects the delay between the input clock signal CLK_IN and the output clock signal CLK_OUT. A stable delay is detected only when N detected delays are identical to one another. If the stable delay is detected, the first signal S1 is generated at the first level to stop the control circuit 760. In addition, the initial parameter INIT_UNLD<1:0> is sent to the load/unload clock control unit 680.

The circuit to detect clock delay 520 is mounted in the control block (not shown) so that the initial parameter INIT_UNL<1:0> can be set before the master circuit (not shown) enters an operation mode and after power is turned on. Whenever the power is turned on, the circuit to detect clock delay 520 detects the delay between the input clock signal CLK_IN and the output clock signal CLK_OUT, and automatically sets the initial parameter INIT_UNLD<1:0>.

Whenever the first signal S1 is at the second level, that is, the detected delays are not identical to one another, the clock generator 630 and the detection circuit 710 are reset. However, a circuit outside the control block (not shown), e.g., the memory or the chipset, where the circuit to detect clock delay 520 is mounted, is not reset. Thus, data that has already been stored may be maintained.

Therefore, if the system clock control unit 770 resets the clock generator 630 and generates the internal reset signal IRST, the reset control unit 775 generates the reset control signal RESET in response to the internal reset signal IRST. The reset control signal RESET resets the memory or the chipset as well as the detection circuit 710. The external circuit, which interfaces with the master circuit (not shown), is also reset along with the clock generator 630 and detection circuit 710. Thus, the delays between the input clock signal CLK_IN and the output clock signal CLK_OUT are detected under the same conditions, and stable operation of the system is guaranteed.

Figures 8, 9:
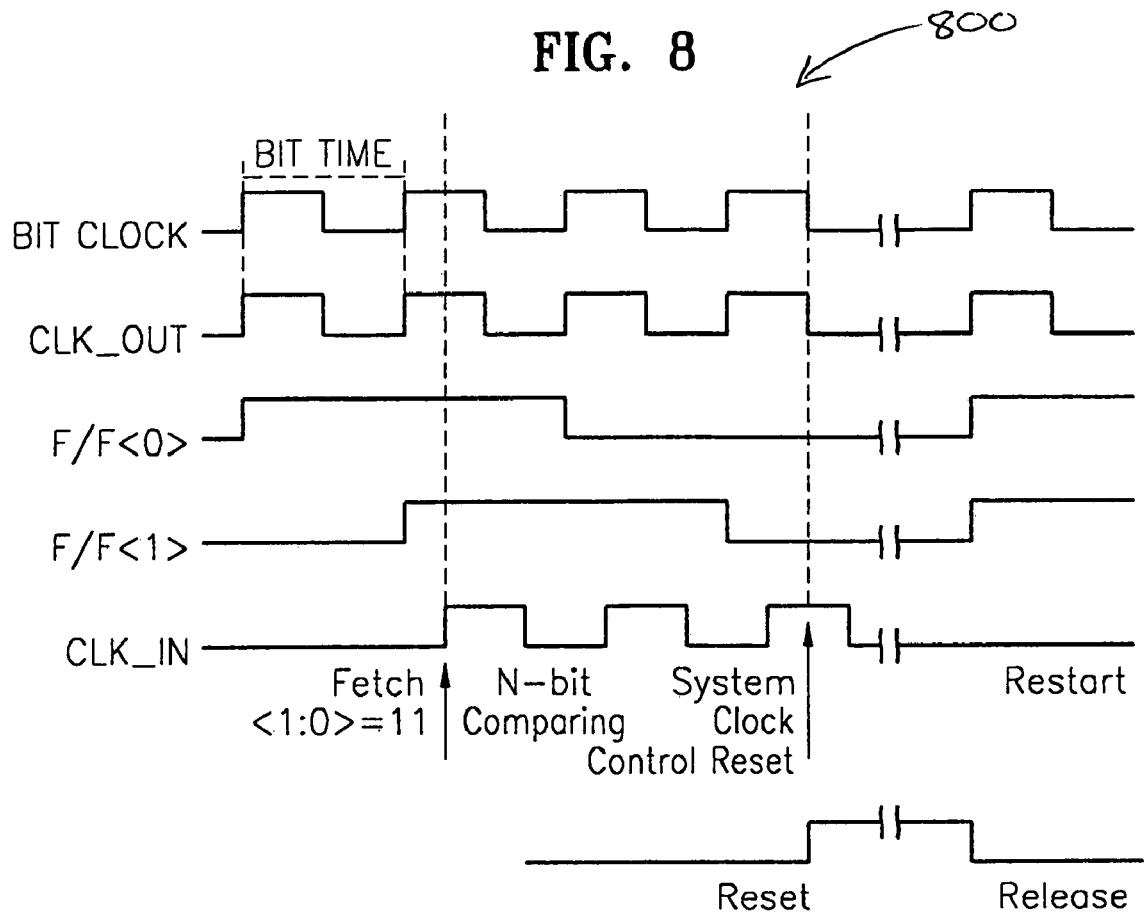
FIG. 8 is a timing diagram showing the operation of the circuit of FIG. 7.
FIG. 9 is a table showing initial parameters generated in the circuit of FIG. 7.

FIG. 8 is a timing diagram indicated generally by the reference numeral 800, and showing the operation of the circuit for detecting clock delay of FIG. 7. Referring to FIGS. 7 and 8, the flip flops 717 and 719 operate in response to the output clock signal CLK_OUT. F/F<1> of FIG. 8 is an output waveform of the flip flop 717, and F/F<0> is an output waveform of the flip flop 719.

The detection unit 720 detects the delay between the input clock signal CLK_IN and the output clock signal CLK_OUT in response to the output waveforms F/F<1> and F/F<0> of the flip flops 717 and 719, respectively. Referring to FIG. 8, if the maximum delay is greater than a 1 bit time and smaller than 2 bit time, the detected delay is "11". The detected delay is determined by reviewing the output waveforms F/F<1> and F/F<0> of the flip flops 717 and 719, respectively, in a rising edge of the input clock signal CLK_IN.

If N detected delays are not identical to one another, the system clock signal unit 770 resets the clock generator 630 and generates the internal reset signal IRST, and the reset control unit 775 resets the detection circuit 710 in response to the internal reset signal IRST. After reset of the clock generator 630 is released, the delays are continuously detected until the detected delays are identical to one another.

FIG. 9 is a table indicated generally by the reference numeral 900, and showing initial parameters generated in the circuit of FIG. 7. Referring to FIG. 9, the initial parameter INIT_UNLD<1:0> is determined by the detected maximum delay. If the detected maximum delay is greater than a 1 bit time and smaller than a 2 bit time, the initial parameter INIT_UNLD<1:0> is "11". This is because DLY<1:0> is "11" as a result of a fetch. If the maximum delay is greater than a 2 bit time and smaller than a 3 bit time, the initial parameter INIT_UNLD<1:0> is "10".

FIG. 10 is a timing diagram, indicated generally by the reference numeral 1000, for explaining the operation of the circuit of FIG. 6.

If the initial value of an unload control signal UNLD is set as "11", the unload control signal UNLD is repeatedly generated as "10", "00", "01" and "11" in response to the output clock signal CLK_OUT. A load control signal LD is repeatedly generated as "01, ", "11", "10", "00" in response to the input clock signal CLK_IN.

If an initial value of the unload control signal UNLD is set as "11", the initial value is greater than a 1 bit time and smaller than a 2 bit time. Thus, the circuit to detect clock delay 520 transmits the clocks corresponding to the unload control signals UNLD<1:0> "10" and "00" in order to avoid being affected by the delay between the input clock signal CLK_IN and the output clock signal CLK_OUT.

Therefore, after the clocks corresponding to the unload control signals UNLD<1:0> "10" and "00" are transmitted, the input data DATA_IN is loaded to the load/unload multiplexer 690 in response to the load control signals LD generated as "01", "11", "10", "00". Then, the input data DATA_IN loaded in response to the unload control signal UNLD generated as "01", "11", "10", "00", is unloaded. Therefore, the circuit for detecting clock delay, according to the present invention, automatically sets the initial parameter corresponding to the delay between the output clock signal CLK_OUT and the input clock signal CLK_IN, and resets at the same time, the master circuit and the external circuit, which interfaces with the master circuit.

As described above, the circuit for detecting clock delay automatically detects the clock delay necessary for setting an initial parameter of a clock forwarding circuit, and resets, at the same time, a master circuit and an external circuit, which interfaces with the master circuit. Therefore, data can be transmitted without any error.

While the present invention has been particularly shown and described with reference to exemplary embodiments thereof, it will be understood by those of ordinary skill in the pertinent art that various changes in form and details may be made therein without departing from the spirit and scope of the present invention as defined by the following claims.

What is claimed is:

1. A digital system comprising:
    a master circuit, which includes a circuit to detect clock delay, receives a system reset signal, and generates output data, an output clock signal with which the output data is synchronized, and a reset control signal which responds to the system reset signal; and
    a slave circuit in signal communication with the master circuit, where the slave circuit is reset in response to the reset control signal using the system reset signal that is generated outside of the master circuit and the slave circuit, receives the output clock signal and the output data, and sends to the master circuit an input clock signal as a feedback signal of the output clock signal and input data that is synchronized with the input clock signal,
    wherein the circuit to detect clock delay generates the reset control signal in response to the system reset signal or an internal reset signal, detects a delay between the output clock signal and the input clock signal, and loads and unloads the input data in response to a variable initialization parameter corresponding to the detected delay.

2. The digital system of claim 1, wherein the internal reset signal is a clock signal generated when detected delays are not identical to one another.

3. A circuit to detect clock delay comprising:
    a delay detection circuit, which detects a delay between an output clock signal and an input clock signal, generates a variable initialization parameter corresponding to the detected delay if detected delays are identical to one another or continuously detects the delays until the detected delays are identical to one another if detected delays are not identical to one another, and generates a reset control signal in response to a system reset signal that is generated outside of a master circuit and a slave circuit; and
    a clock forwarding circuit in signal communication with the delay detection circuit, where the clock forwarding circuit loads and unloads input data in response to the generated variable initialization parameter, and wherein the clock forwarding circuit comprises:
    a clock generator, which is reset in response to output of a system clock control unit and generates a predetermined clock signal;
    an internal data bus in signal communication with the clock generator, which is used for data interface with a predetermined master circuit;
    a data control unit in signal communication with the internal data bus, which is connected to the internal data bus and outputs data to a slave circuit in response to the predetermined clock signal;
    an output clock signal control unit in signal communication with the internal data bus, which outputs the output clock signal to the slave circuit in response to the predetermined clock signal;
    an input clock signal control unit in signal communication with the internal data bus, which receives and controls the predetermined clock signal and outputs a controlled clock signal;
    a load/unload clock control unit in signal communication with the internal data bus, which receives the controlled clock signal and generates load control signals and unload control signals in response to the variable initial parameter; and
    a load/unload multiplexer in signal communication with the internal data bus, which receives input data inputted from the slave circuit and unloads the input data to the internal data bus, through the data control unit, in response to the load control signals and the unload control signals.

4. The circuit of claim 3, wherein the delay detection circuit further comprises:
    a detection circuit, which is used to detect a delay between the output clock signal and the input clock signal;
    a comparison circuit in signal communication with the detection circuit, which compares the detected delays and generates the initial parameter when the detected delays are identical to one another; and
    a control circuit in signal communication with the comparison circuit, where if detected delays are not identical to one another, resets the detection circuit, generates the reset control signal in response to the internal reset signal, and controls the comparison circuit to perform a comparison operation by N-bit free running until all the detected delays are identical to one another.

5. The circuit of claim 4, wherein the detection circuit comprises:
    a counting unit, which includes two D-type flip flops that are synchronized with the output clock signal and are reset by the input clock signal; and
    a detection unit in signal communication with the counting unit, which receives output of the counting unit and detects the delay between the output clock signal and the input clock signal in response to the input clock signal.

6. The circuit of claim 4, wherein the comparison circuit further comprises:
    a latch unit, which includes a demultiplexer and N latches, respectively latches most significant bits and least significant bits of the delays outputted from the detection unit by N-bit free running; and
    a comparison unit in signal communication with the latch unit, which compares the most significant bits and least significant bits outputted from the latch unit, outputs one of the most significant bits and one of the least significant bits as the initial parameters, and outputs a first signal at a first level if all most significant bits and least significant bits are respectively identical to one another, or outputs the first signal at a second level if all most significant bits and least significant bits are not respectively identical to one another.

7. The circuit of claim 6, wherein the control circuit comprises:
an N-bit free running counter/decoder, which controls the demultiplexer to perform N-bit free running in response to the first signal and sends a predetermined clock signal to the latch unit;
a system clock control unit in signal communication with the counter/decoder, which receives the clock signal in response to the first signal and outputs the clock signal as an internal reset signal; and
a reset control unit in signal communication with the system clock control unit, which receives the system reset signal or the internal reset signal, sends the received system reset signal or internal reset signal to the N-bit free running counter/decoder, resets the detection unit, and outputs the system reset signal or the internal reset signal as the reset control signal.

8. The circuit of claim 7, wherein the output clock signal is a signal outputted from a predetermined master circuit, the input clock signal is a signal outputted from a predetermined slave circuit, and the input clock signal is a feedback clock of the output clock signal.

9. The circuit of claim 3, wherein the internal reset signal is a clock signal generated when one of the detected delays is not identical to other detected delays.

10. The circuit of claim 3, wherein the reset control signal is generated when the system reset signal or the internal reset signal is activated.

11. A circuit to detect clock delay as defined in claim 3, the circuit further comprising:
detection means for detecting successive delays between an output clock signal and an input clock signal; and
reset means for comparing the detected successive delays between the output clock signal and the input clock signal, generating an initial parameter responsive to at least one of the delays and generating an internal reset signal if the detected delays are not similar to each another, and generating an initial parameter responsive to an approximated delay and generating a reset control signal in response to the system reset signal if the detected delays are similar to each another.

12. A method of detecting clock delay comprising:
(a) detecting a delay between an output clock signal and an input clock signal and automatically generating a variable initialization parameter corresponding to the detected delay if the detected delays are identical to one another;
(b) continuously detecting the delay until the detected delays are identical to one another and generating a reset control signal in response to the system reset signal that is generated outside of a master circuit and a slave circuit, if the detected delays are not identical to one another; and
(c) loading and unloading input data in response to the automatically generated variable initialization parameter, wherein step (c) further comprises:
(c1) generating a predetermined clock signal;
(c2) outputting the output clock signal to a slave circuit in response to the predetermined clock signal;
(c3) receiving and controlling the predetermined clock signal, and outputting a controlled clock signal;
(c4) receiving the controlled clock signal, and generating load control signals and unload control signals in response to the variable initialization parameter; and
(c5) receiving input data inputted from the slave circuit, and unloading the input data in response to the load control signals and the unload control signals.

13. The method of claim 12, wherein step (a) further comprises:
(a1) detecting and outputting a delay between the output clock signal and the input clock signal;
(a2) respectively latching most significant bits and least significant bits of the delays outputted in step (a1); and
(a3) comparing the most significant bits and the least significant bits outputted in step (a2), outputting one of the most significant bits and one of the least significant bits as the initial parameters, and outputting a first signal at a first level if all most significant bits and least significant bits are respectively identical to one another, or outputting the first signal at a second level if all most significant bits and least significant bits are not respectively identical to one another.

14. The method of claim 13, wherein step (b) is characterized by generating the reset control signal for resuming step (a) in response to the first signal if one of the detected delays is not identical to other detected delays and resuming step (a) by N-bit free running until the detected delays are identical to one another.

15. The method of claim 14, wherein step (b) further comprises:
(b1) generating an internal reset signal in response to the first signal and a predetermined clock signal;
(b2) receiving the system reset signal or the internal reset signal, and generating the reset control signal; and
(b3) performing N-bit free running in response to the first signal and generating an N-bit free running signal.

16. The method of claim 12, wherein the output clock signal is outputted from a predetermined master circuit, the input clock signal is outputted from a predetermined slave circuit, and the input clock signal is a feedback clock of the output clock signal.

17. The method of claim 12, wherein the internal reset signal is generated when the detected delays are not identical to one another.

18. The method of claim 12, wherein the reset control signal is generated when the system reset signal or the internal reset signal is activated.

* * * * *